United States Patent
Rotem et al.

(10) Patent No.: US 10,997,007 B2
(45) Date of Patent: May 4, 2021

(54) FAILURE PREDICTION SYSTEM AND METHOD

(71) Applicant: MELLANOX TECHNOLOGIES, LTD., Yokneam (IL)

(72) Inventors: Sagi Rotem, Adi (IL); Roee Shapiro, Zichron Yaakov (IL); Ihab Khoury, Tel Aviv (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 28 days.

(21) Appl. No.: 16/553,248

(22) Filed: Aug. 28, 2019

(65) Prior Publication Data

US 2021/0063486 A1 Mar. 4, 2021

(51) Int. Cl.
*G06F 11/07* (2006.01)
*G01R 31/3183* (2006.01)
*H04L 1/20* (2006.01)
*G06F 11/263* (2006.01)

(52) U.S. Cl.
CPC ...... *G06F 11/076* (2013.01); *G01R 31/31835* (2013.01); *G06F 11/0793* (2013.01); *G06F 11/263* (2013.01); *H04L 1/203* (2013.01)

(58) Field of Classification Search
CPC . H04B 10/07953; H04B 17/309; H04L 1/203; H04L 1/20; G06F 11/076
See application file for complete search history.

(56) References Cited

U.S. PATENT DOCUMENTS

| | | | | |
|---|---|---|---|---|
| 4,713,810 A | * | 12/1987 | Chum | H04B 17/40 370/243 |
| 4,862,480 A | * | 8/1989 | Gupta | H04L 1/004 375/259 |
| 5,023,872 A | * | 6/1991 | Annamalai | H04L 1/20 714/704 |
| 5,585,954 A | * | 12/1996 | Taga | H04B 10/07953 398/154 |
| 6,507,012 B1 | * | 1/2003 | Medard | H04B 10/85 250/225 |
| 7,103,509 B2 | | 9/2006 | Shah et al. | |
| 7,124,332 B2 | | 10/2006 | Constantinescu | |
| 7,424,666 B2 | | 9/2008 | Chandwani et al. | |
| 8,600,685 B2 | | 12/2013 | Kalgren et al. | |
| 2003/0002197 A1 | * | 1/2003 | Seng | G11B 20/20 360/76 |
| 2004/0120706 A1 | * | 6/2004 | Johnson | H04B 10/0771 398/10 |

(Continued)

OTHER PUBLICATIONS

Keysight., "Anatomy of a 400GE FEC", 1 page, Oct. 2017.

(Continued)

*Primary Examiner* — Steve N Nguyen
(74) *Attorney, Agent, or Firm* — Kligler & Associates Patent Attorneys Ltd

(57) ABSTRACT

A method including determining, for a given hardware link, whether a signal error rate for signals sent over the given hardware link is beyond a given threshold, when the signal error rate is beyond the given threshold, generating an error indication for the given hardware link, the error indication including a prediction that a hardware component associated with the given hardware link is likely to fail. Related apparatus and methods are also provided.

10 Claims, 4 Drawing Sheets

(56) References Cited

U.S. PATENT DOCUMENTS

| | | | | |
|---|---|---|---|---|
| 2004/0152423 A1* | 8/2004 | Reznik | ............... | H04W 52/241 |
| | | | | 455/67.11 |
| 2006/0062573 A1* | 3/2006 | Uchida | ............... | H04B 10/032 |
| | | | | 398/5 |
| 2013/0036335 A1* | 2/2013 | Kim | ...................... | G09G 3/006 |
| | | | | 714/704 |
| 2014/0161437 A1* | 6/2014 | Miyabe | ............... | H04B 10/032 |
| | | | | 398/5 |
| 2017/0054518 A1* | 2/2017 | Cho | .................... | H04B 17/336 |
| 2018/0006717 A1 | 1/2018 | Okano | | |
| 2018/0109315 A1* | 4/2018 | Bouda | ............. | H04B 10/07953 |
| 2019/0305888 A1* | 10/2019 | Das Sharma | ......... | H04L 1/0057 |

OTHER PUBLICATIONS

Mohammed et al., "Failure prediction using machine learning in a virtualised HPC system and application", Cluster Computing, vol. 22, issue 2, pp. 471-485, Jun. 2019.

Chakma., "Optical Signal to Noise Ratio (OSNR)", Presentation, International University Bremen, pp. 1-18, Spring 2005.

Krishnan et al., "Mechanisms for Optimizing Link Aggregation Group (LAG) and Equal-Cost Multipath (ECMP) Component Link Utilization in Networks", Internet Engineering Task Force (IETF), RFC 7424, pp. 1-29, Jan. 2015.

\* cited by examiner

FAILURE PREDICTION SYSTEM AND METHOD

FIELD OF THE INVENTION

The present invention relates to systems and methods for generating and analyzing error indications in hardware-based systems, and particularly but not exclusively to systems and methods for predicting failure of a hardware component.

BACKGROUND OF THE INVENTION

Some systems for generating and analyzing error indications in hardware-based systems are known.

SUMMARY OF THE INVENTION

The present invention, in certain embodiments thereof, seeks to provide improved systems and methods for generating and analyzing error indications in hardware-based systems.

There is thus provided in accordance with an exemplary embodiment of the present invention a method including determining, for a given hardware link, whether a signal error rate for signals sent over the given hardware link is beyond a given threshold, and when the signal error rate is beyond the given threshold, generating an error indication for the given hardware link, the error indication including a prediction that a hardware component associated with the given hardware link is likely to fail.

Further in accordance with an exemplary embodiment of the present invention the determining whether the signal error rate is beyond the given threshold includes determining a corrected error rate and an uncorrected error rate, comparing the corrected error rate and the uncorrected error rate, and when a result of comparing the corrected error rate and the uncorrected error rate is beyond the given threshold, generating an error indication for the given hardware link.

Still further in accordance with an exemplary embodiment of the present invention the uncorrected error rate includes raw bit error rate (raw BER), and the corrected error rate includes effective bit error rate (effective BER).

Additionally in accordance with an exemplary embodiment of the present invention the signal error rate is determined to be beyond the given threshold according to the formula $abs(log(\text{effective BER}) - log(\text{raw BER})) < t$ where t is the given threshold, and where the raw BER is more than a minimum value.

Moreover in accordance with an exemplary embodiment of the present invention.

Further in accordance with an exemplary embodiment of the present invention t is approximately equal to 4.

Still further in accordance with an exemplary embodiment of the present invention t is equal to 4.

Additionally in accordance with an exemplary embodiment of the present invention the given hardware link includes an optical link, and the determining whether the signal error rate is beyond the given threshold includes determining a received signal-to-noise ratio (received SNR) for the optical link.

Further in accordance with an exemplary embodiment of the present invention the determining whether the signal error rate is beyond the given threshold includes determining that the received SNR is below approximately 9 dB.

Additionally in accordance with an exemplary embodiment of the present invention the determining whether the signal error rate is beyond the given threshold includes determining that the received SNR is below 9 dB.

Moreover in accordance with an exemplary embodiment of the present invention the networking element includes a switch.

Further in accordance with an exemplary embodiment of the present invention the method also includes, after generating the error indication, when the signal error rate is no longer beyond the given threshold, generating a recovery indication for the given hardware link, the recovery indication indicating that it is no longer predicted that the hardware component associated with the given hardware link is likely to fail.

There is also provided in accordance with another exemplary embodiment of the present invention a failure forecasting system including link fail forecast circuitry configured to determine, for a given hardware link, whether a signal error rate for signals sent over the given hardware link is beyond a given threshold, and error determination circuitry configured, when the signal error rate is beyond the given threshold, to generate an error indication for the given hardware link, the error indication including a prediction that a hardware component associated with the given hardware link is likely to fail.

Further in accordance with an exemplary embodiment of the present invention the link fail forecast circuitry is configured to determine whether the signal error rate is beyond the given threshold by determining a corrected error rate and an uncorrected error rate, comparing the corrected error rate and the uncorrected error rate, and when a result of comparing the corrected error rate and the uncorrected error rate is beyond the given threshold, generating an error indication for the given hardware link.

Still further in accordance with an exemplary embodiment of the present invention the uncorrected error rate includes raw bit error rate (raw BER), and the corrected error rate includes effective bit error rate (effective BER).

Additionally in accordance with an exemplary embodiment of the present invention the signal error rate is determined to be beyond the given threshold according to the formula $abs(log(\text{effective BER}) - log(\text{raw BER})) < t$ where t is the given threshold, and where the raw BER is more than a minimum value.

Moreover in accordance with an exemplary embodiment of the present invention t is approximately equal to 4.

Further in accordance with an exemplary embodiment of the present invention t is equal to 4.

Still further in accordance with an exemplary embodiment of the present invention the given hardware link includes an optical link, and the signal error rate is determined to be beyond the given threshold based on a received signal-to-noise ratio (received SNR) for the optical link.

Additionally in accordance with an exemplary embodiment of the present invention the signal error rate is determined to be beyond the given threshold when the received SNR is below approximately 9 dB.

Moreover in accordance with an exemplary embodiment of the present invention the signal error rate is determined to be beyond the given threshold when the received SNR is below 9 dB.

Further in accordance with an exemplary embodiment of the present invention the networking element includes a switch.

Still further in accordance with an exemplary embodiment of the present invention wherein the error determination circuitry is also configured, after the generating the error indication, when the signal error rate is no longer beyond the given threshold, to generate a recovery indication for the given hardware link, the recovery indication including an indicating that it is no longer predicted that the hardware component associated with the given hardware link is likely to fail.

BRIEF DESCRIPTION OF THE DRAWINGS

The present invention will be understood and appreciated more fully from the following detailed description, taken in conjunction with the drawings in which.

DETAILED DESCRIPTION OF AN EMBODIMENT

Figure 1:
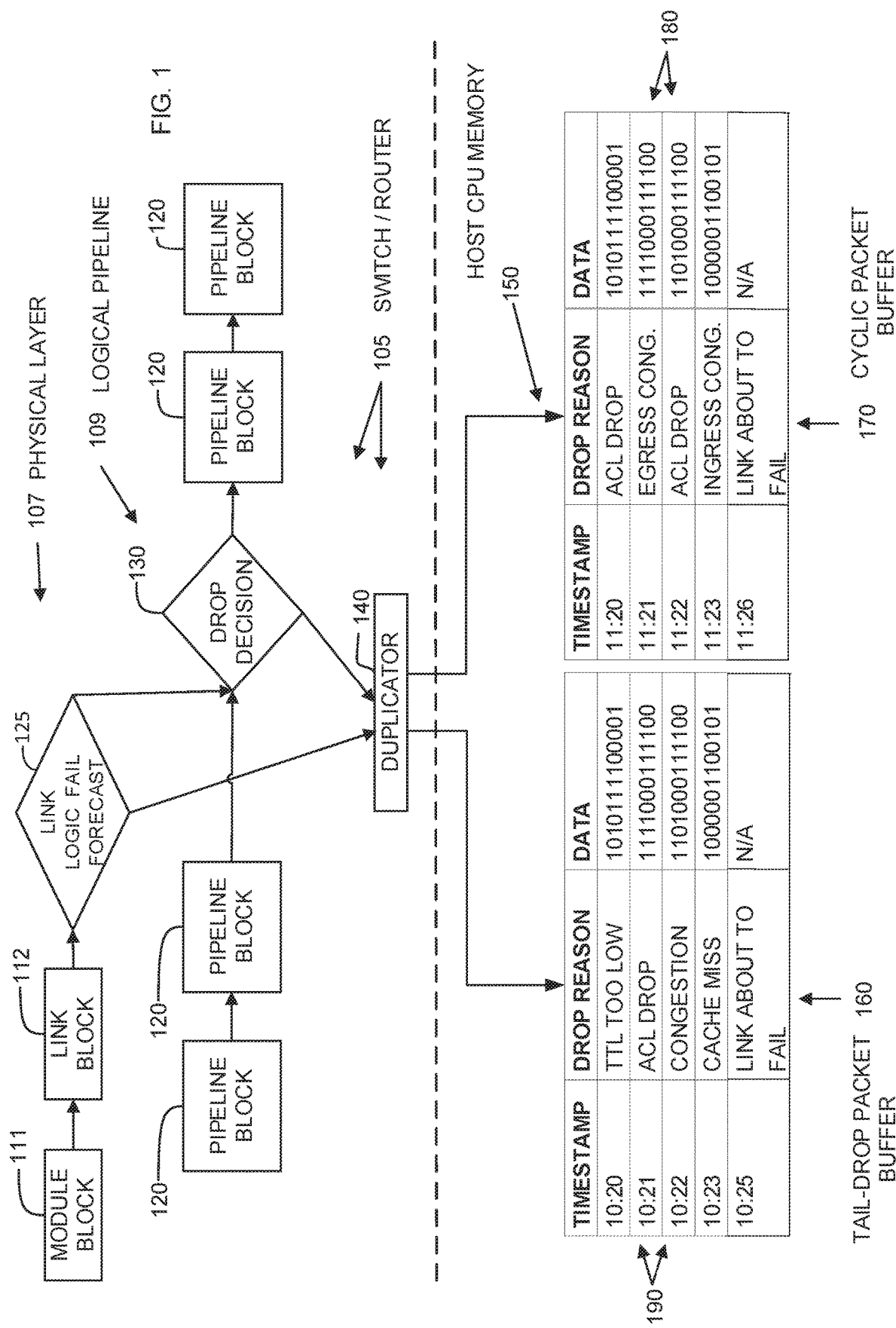
FIG. 1 is a simplified block diagram illustration of an exemplary system including a sub-system for predicting failure of a hardware component, the system being constructed and operative in accordance with an exemplary embodiment of the present invention.

By way of introduction, the inventors of the present invention believe that L1 ("layer 1", a term known in the art of networking from the well-known OSI model) physical and link stability is an important problem in large data centers. Significant time and money is believed to be spent debugging and analyzing link failure as well as in dealing with jobs/applications that stop functioning or suffer from poor performance because of bad links. Persons skilled in the art will thus appreciated that ability to predict link failure in advance would significantly improve computer system performance and reliability, and would save resources.

Perhaps even more problematic is a situation in which a link "flaps" (goes up and down) rapidly. Such "flapping" may cause network instability problems which stem from: routing protocols needing to calculate routes and needing to send events to other switches; non-even distribution of traffic that may overload the remaining links in an equal-cost multi-path (ECMP)/link aggregation (LAG) group. Such non-even distribution of traffic and possible overloading could take place if (by way of one particular non-limiting example) four links had been used in an ECMP LAG group; after failure of one link, all traffic would be carried on three links, which could lead to non-even distribution and possible overloading. Thus, while methods exist to work around such problem at the network protocol levels by adding resilience for such events (such as by using LAG/ECMP, with the option of having additional links which, in a non-problem case; may provide extra bandwidth; such a case of additional links being discussed below), these methods are generally used as a resiliency mechanism, until the root cause of the issue is fixed. It is appreciated that LAG/ECMP provide resiliency for different OSI layers, such as layer 2 and layer 3. The root cause may be fixed, for example, by replacing a cable which causes the problem.

The present invention, in certain exemplary embodiments thereof, is directed to predicting failure of a link, even if it that link is presently working well, and no link error is reflected at the application level in the system. In certain exemplary embodiments, the prediction takes place based on determining that a signal error rate is beyond a given threshold.

In one particular non-limiting example of the use of the term "threshold" herein; raw bit error rate (raw BER) may be compared to effective bit error rate (effective BER), effective BER generally being derived from raw BIER by means of error correction, such as forward error correction (FEC), as is known in the art. Specifically, raw BER represents all errors, while effective BER represents remaining errors, errors that could not be corrected using FEC. When raw BER and effective BER become relatively close together, this can be taken as a sign that correction is becoming ineffective, so that soon correction of errors will no longer be effective, and the link in question will no longer function effectively because a relevant system component (generally a cable) will have failed. In the opinion of the inventors of the present invention, in a normally functioning system the absolute value of the log in base 10 of raw BER tends be more than approximately 8; the above statement regarding closeness of raw BER and effective BER refers to such a case. It is appreciated that absolute value is used, since the bit error rate may be very small, so that the log in base 10 would be negative. The units of BER are: errors/(bits per second), with a typical raw BER in a well-functioning system being on the order of $10^{-8}$, so that the absolute value of the log would be approximately 8; in some cases of a well-functioning system, the absolute value of the log could be in a range of 5 to somewhat more than 8, for example (this range being what is meant by "more than approximately 8" in the discussion immediately above).

In another particular non-limiting example which may be particularly apt in the case of an optical cable and an optical link, when the received signal-to-noise ratio (received SNR) falls below a certain level, this can be taken as a sign that the optical link is becoming overly noise, so that soon the optical link will no longer function effectively, and a relevant system component (generally an optical cable) will have failed.

It is possible in cases referred to above (for example, in either the BER case or the SNR case) that the link in question may recover, in the sense of no longer fulfilling the criterion indicating that failure is predicted; in such a case, a prediction that the link will no longer fail (cancelling, in a sense, the previous prediction of link failure) may be made.

It is believed by the inventors of the present invention that some existing systems work reactively (by reacting post-failure); once a link is already down, notification is sent (generally to a human system/network operator), and a network operator will need to replace the failed cable. Alternatively or additionally, in some existing systems, at the logical level several physical links may be bound to a single logical link using LAG/ECMP (Link Aggregation Group/Equal Cost Multipath protocols, as are known in the art); in such a scenario, if a physical link ceases to function, another physical link may take its place; such a "solution", however, may have serious performance or cost impact by, for example, using/setting-aside additional physical components for backup use, "just in case" something goes wrong.

Reference is now made to FIG. 1 which is a simplified block diagram illustration of an exemplary system including a sub-system for predicting failure of a hardware component, the system being constructed and operative in accordance with an exemplary embodiment of the present invention. It is appreciated that the exemplary system of FIG. 1 depicts and describes one possible way in which a subsystem for predicting failure of a hardware component may be used as part of a larger system, it being expressly contemplated that a subcombination including such a subsystem (as further described below), without other elements shown in FIG. 1, includes an alternative exemplary embodiment of the present invention.

The system of FIG. 1 comprises a switch/router 105, which may be a switch, a router, or a combined switch/router. The switch/router 105 includes a physical layer 107 and a logical pipeline 109, as is known in the art.

The logical pipeline includes a plurality of pipeline blocks 120 which, as is known in the art, perform cooperatively to switch and/or route incoming packets (not shown) to their destination. The switch/router may also be termed herein a "networking element".

By way of non-limiting example, the switch 105 may be implemented as: "pure" hardware (such as hard-wired logic); an Application Specific Integrated Circuit (ASIC); a multi-core Networking Processing Unit (NPU, one suitable non-limiting example of which may be the EzChip NPS-400, commercially available from Mellanox Technologies Ltd.); a Field Programmable Gate Array (FPGA); or a software (SW) component, provided that the SW component is capable of handling packets at full packet input speed, also known in the art as "line rate" or "wire speed".

The system of FIG. 1 also includes two blocks; each of which is configured to handle error events:

a link logic fail forecast block 125, which is included in the physical layer 107 and which, as described in more detail below, is configured to determine, based on signal error rates, whether a hardware component associated with a given hardware link is likely to fail; and a drop decision block 130, which is operatively associated with the plurality of pipeline blocks 120 and which is configured to determine whether a given packet being processed by the plurality of pipeline blocks 120 is to be dropped rather than being successfully switched/routed to its destination by the system of FIG. 1.

A non-limiting list of exemplary reasons that a given packet might be dropped includes the following:

Link error; a packet is dropped due to link level error, for example frame check sequence (FCS) error;

Packet buffer overflow error; a packet is dropped due to inadequate packet buffer space;

VLAN filter; a packet is filtered out in accordance with a VLAN filter;

Spanning tree; a loop has been detected in accordance with a spanning tree algorithm, so that the given packet should not be forwarded (although it is appreciated that such packets might be separately analyzed and correlated with system flows to better understand network traffic disruptions);

TTL (time to live) too low; and

ACL—ACL reason drop; a packet is dropped due to a limitation in an appropriate Access Control List.

As stated above, the list of exemplary reasons is non-limiting; persons skilled in the art will appreciate that many other reasons for dropping a given packet might be possible.

If a given packet is determined to be dropped, the given packet is passed to a duplicator 140, which is configurated to duplicate the given packet and to export one copy thereof to a tail-drop packet buffer 160 and one copy thereof to a circular buffer 170.

Also included in the physical layer 107, in addition to the link logic fail forecast block 125, are a module block 111 and a link block 112. The module block 111 is in physical communication with optical ports/links and provides an indication of SNR as described herein, measuring SNR in such a module being known in the art. The link block 112 is in physical communication with ports links, and (among other functions) provides forward error correction (FEC) as is known in the art, and provides counters of error rate from which raw BER and effective BER can be determined, based on error rate before and after FEC respectively, Generally, but not necessarily, FEC counters are included in hardware (hard-wired logic), while BER is continuously computed in firmware. The indication of SNR from the module block 111 and the raw BER and effective BER from the link block 112 are supplied to the link fail forecast block 125.

The link logic fail forecast block 125, together with the module block 111 and the link block 112, is also termed herein "link fail forecast circuitry".

If the link fail forecast block 125 determines that a hardware component associated with a given hardware link is likely to fail, an event indicating that a link is about to fail may be passed to the duplicator 140 and thence to the tail-drop packet buffer 160 and the circular buffer 170. In the case of a determination by the link fail forecast block 125 that a hardware component associated with a given hardware link is likely to fail, associated packets (those which are part of the aforementioned event) may be passed to the duplicator 140 for later analysis, even though such packets are not necessarily dropped. It is appreciated, however, that duplication in case of an event indicating that a link is about to fail may be optional; in alternative exemplary embodiments, the event may bypass the duplicator 140, and may be passed only to a single buffer (such as, for example, to the tail-drop packet buffer 160 or to another appropriate buffer, not shown) for later analysis.

A determination by the link fail forecast block 125 that a hardware component associated with a given hardware link is likely to fail may be based on determining that a signal error rate for signals sent over the given hardware link is beyond a given threshold. By way of one non-limiting example, an uncorrected error rate (hit error rate before correction, which may be termed raw bit error rate (raw BER)) may be compared to a corrected error rate (bit error rate remaining after correction, which may be termed effective bit error rate (effective BER)). It is known in the art to use error correction mechanisms such as, by way of non-limiting example; forward error correction (FEC) to correct those errors which are correctable; the remaining rate or errors, as explained above, may be termed effective BER. By further particular non-limiting example, if $$\text{abs}(\log(\text{effective } BER) - \log(\text{raw } BER)) < t$$

with t representing a threshold (such as 4, or close to/approximately 4, such as, for example; between 4.2 and 4), then the link fail forecast block 125 may determine that the given hardware link is likely to fail.

By way of another non-limiting example, in a case where a given hardware link includes an optical link, the link fail forecast block 125 may determine that the optical link is likely to fail when a certain level of received signal-to-noise ratio (received SNR) is reached for the optical link. By way of one non-limiting example, if the SNR falls below approximately 9 dB or below exactly 9 dB, the link fail forecast block 125 may determine that the optical link is likely to fail. In this non-limiting example, "approximately" refers to a range of 8 dB to 10 dB.

In exemplary embodiments of the present invention, the tail-drop packet buffer 160 and the circular packet buffer 170 are included in a host CPU (host processor) memory 150, which is disposed in a host processor and is operatively associated with the switch 105. In some exemplary embodiments, the switch 105 has direct memory access (DMA) to the host processor memory 150.

As packets are inserted (in exemplary embodiments at line rate, as defined above) into the tail-drop packet buffer 160, once the tail-drop packet buffer 160 becomes full, further packets are discarded (not inserted into the tail-drop packet buffer 160). By contrast, as packets are inserted into the circular packet buffer 170, the circular packet buffer 170 is managed as a circular buffer so that (if, for example, the circular packet buffer 170 has room for n packets), at any given time the last n packets entered into the circular packet buffer 170 are stored therein, with new packets overwriting old packets.

The operation of the exemplary system of FIG. 1 is now further described.

Persons skilled in the art will appreciate that many types of traffic may be handled by a switch, such as the switch 105 of FIG. 1. There may be a plurality of reasons (such as, by way of non-limiting example, the exemplary reasons for dropping a packet described above) because of which a packet (also known as a data frame) may be dropped (not delivered).

As depicted in FIG. 1 and as described above, when a given packet is determined to be dropped, the given packet is passed to the duplicator 140, which is configured to duplicate the given packet and to export one copy thereof to the tail-drop packet buffer 160 and one copy thereof to the circular buffer 170. In exemplary embodiments of the present invention, the tail-drop packet buffer 160 and the circular packet buffer 170 are included in the host CPU (host processor) memory 150, which is disposed in a host processor and is operatively associated with the switch 105. In some exemplary embodiments, the switch 105 has direct memory access (DMA) to the host processor memory 150.

In exemplary embodiments, each packet 190 delivered to the tail-drop packet buffer 160 includes a timestamp, a drop reason, and actual data included in each said packet 190. Similarly, each packet 180 delivered to the circular buffer 170 includes a timestamp, a drop reason, and actual data included in each said packet 180.

When a packet is received in the tail-drop packet buffer 160 and/or the circular packet buffer 170, a CPU event may be created (soon or immediately); this allows both automated analysis and quick notification of a system user/administrator who might wish to take immediate action.

In the host processor 150, any appropriate analysis may thus take place on the packets 180 and on the packets 190 to determine characteristics of the dropped packets. Such analysis may include, by way of non-limiting example, any one or more of: start time of dropping of packets; end time of dropping of packets; one or more reasons for dropping of packets; any possible commonality between the actual data included in packets. Because the packet data (in exemplary embodiments, all packet data) is included in the packets 180 and in the packets 190, the analysis may include mapping to particular flows/applications and may include deterministic understanding of the types of traffic/transaction/operation which was negatively affected by packet drop. Output of the analysis may be used, either in an automated way or by a user/system administrator, to modify network configuration, hardware configuration, hardware components, or any other applicable parameters/components in order to address and hopefully to resolve) the root causes of the analyzed problem.

Without limiting the generality of the foregoing, it is particularly appreciated that because both the tail-drop packet buffer 160 which holds information on the first packets dropped and the cyclic packet buffer 170 which holds information on the most recent packets dropped are maintained, it is possible inter cilia to determine a begin time and an end time of a network traffic disruption by examining both packets in the tail-drop packet buffer 160 and packets in the cyclic packet buffer 170. Thus, a helpful synergy is achieved by providing both the tail-drop packet buffer 160 and the cyclic packet buffer 170.

The above discussion of the operation of the exemplary system of FIG. 1 applies, mutatis mutandis, in a case where the link fail forecast block 125 determines that a hardware component associated with a given hardware link is likely to fail, and events (as described above) are similarly passed to the duplicator 140 and thence to the tail-drop packet buffer 160 and the circular buffer 170; in the case of events passed by the link fail forecast block 125, the reason would, in exemplary embodiments, indicate that link failure is predicted to occur. The data field, in the case of such events, is generally non applicable (as shown in FIG. 1), it being appreciated that in alternative exemplary embodiments, appropriate metadata regarding the link failure forecast (such as, by way of non-limiting example, data indicating why link failure is forecasted) may be included.

Furthermore, as described above, there may be cases in which a given hardware link may recover, in the sense of no longer fulfilling the criterion indicating that failure is predicted; in such a case, a prediction that the link will no longer fail (cancelling, in a sense, the previous prediction of link failure) may be made, and an appropriate event may then be passed on, similarly to the event indicating a link fail forecast as described above, but in this case "cancelling" the link fail forecast.

It is appreciated that the exemplary system of FIG. 1 depicts and describes one possible way in which the link fail forecast block 125 may be used as part of a larger system, it being expressly contemplated that a subcombination including the link fail forecast block 125, or the link fail forecast circuitry as described above, without other elements shown in FIG. 1, includes an alternative exemplary embodiment of the present invention.

Figure 2:
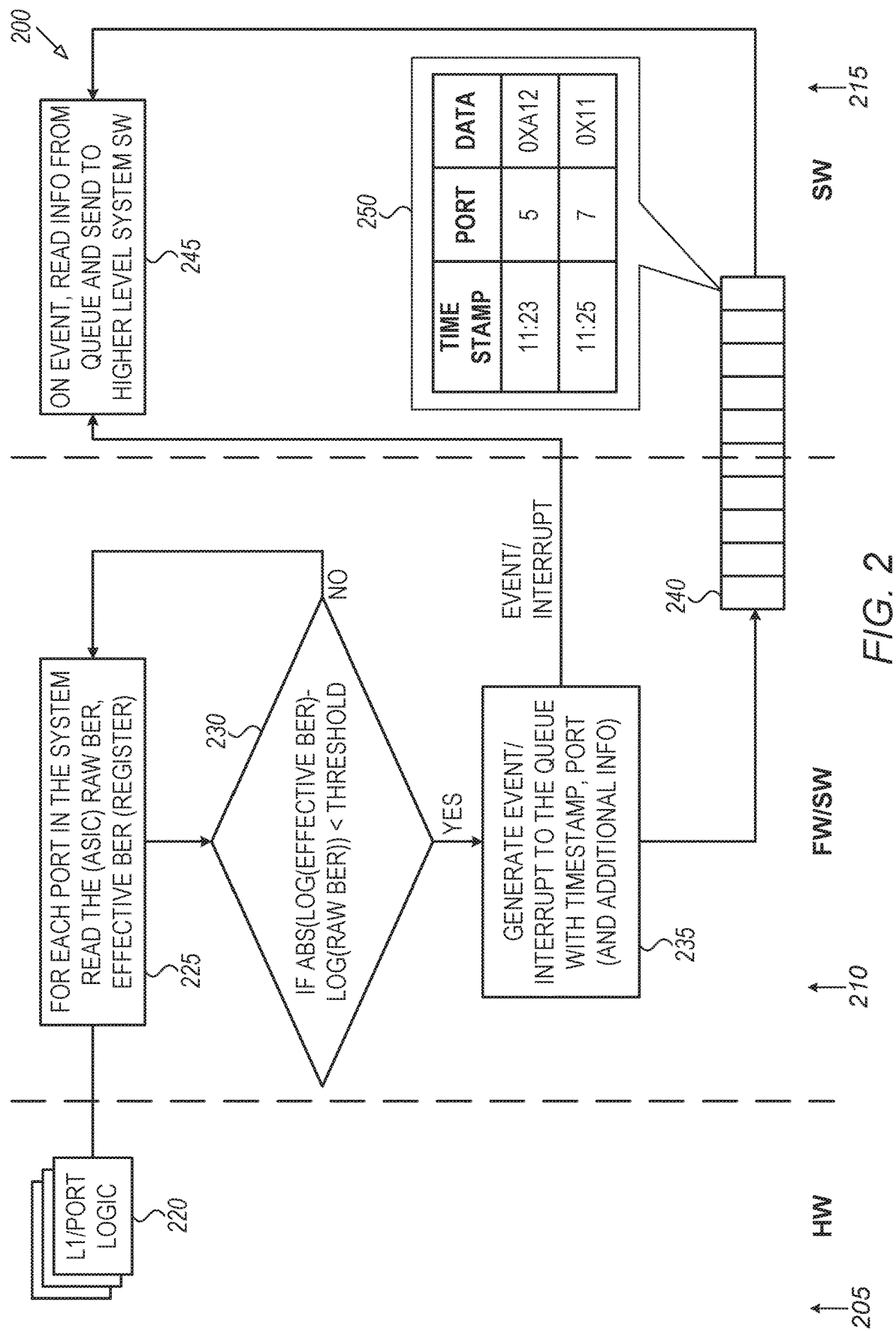
FIG. 2 is a simplified partly block diagram, partly flowchart illustration of an exemplary system for predicting failure of a hardware component, constructed and operative in accordance with an exemplary embodiment of the present invention.

Reference is now made to FIG. 2, which is a simplified partly block diagram, partly flowchart illustration of an exemplary system for predicting failure of a hardware component, constructed and operative in accordance with an exemplary embodiment of the present invention.

The system of FIG. 2, generally designated 200, is shown as including hardware 205, firmware or software 210, and software 215. It is appreciated, however, that each of the hardware 205, firmware or software 210, and software 215 are so designated by way of non-limiting example, such that exemplary embodiments of the present invention in which (by way of non-limiting example) the software 215 is implemented in firmware are not ruled out. Furthermore, a sub-combination of the system of FIG. 2, not including the hardware 205 as depicted in FIG. 2, is expressly contemplated as an alternative exemplary embodiment of the present invention.

The system of FIG. 2 includes L1/Port logic 220, which may be similar to the plurality of pipeline blocks 120 described above with reference to FIG. 1. A sub-combination of the system of FIG. 2, not including the L1/Port logic 220 (but receiving data therefrom), is expressly contemplated as an alternative exemplary embodiment of the present invention.

The system of FIG. 2 further includes components, which are depicted as included in firmware or software 210 (see above discussion of firmware or software 210), and which are depicted in the form of flowchart blocks. Persons skilled in the art will appreciate, based on the depiction in FIG. 2 and the discussion herein, how to implement the flowchart blocks of FIG. 2 in firmware or software (or, for that matter, in hardware), The flowchart blocks of FIG. 2, shown as included in firmware or software 210, are now described.

For each port in a larger system in which the system of FIG. 2 may be included (those ports being represent by the L1/Port logic 220), determine a relevant error rate for that port (step 225). While FIG. 2 depicts, in step 225, a particular case in which raw BER is read (generally from an ASIC or from another implementation, as described above with reference to FIG. 1) and effective BER is read (generally from a register in which effective BER is kept), it is expressly appreciated and contemplated that raw BER and effective BER are only one particular non-limiting example. In general, a signal error rate for signals sent over the given port is determined, and in some cases a raw error rate and a corrected error rate are determined. In other cases, as described above in the case of an optical link (optical port), received SNR may be determined as described above. For simplicity of depiction and description and without limiting the generality of the foregoing, the remainder of the description of FIG. 2 will relate to the raw BER/effective BER case; persons skilled in the art will appreciate that the description also applies at least to the other cases mentioned, mutatis mutandis.

The effective BER is compared to the raw BER step 230) according to the formula:

$$\mathrm{abs}(\log(\text{effective } BER) - \log(\text{raw } BER)) < \text{threshold}$$

with the threshold having a value of 4, or close to approximately 4, such as, for example, between 4.2 and 4.

If the value is determined in step 230 to be not below the threshold, the method returns to step 225 (possibly with some appropriate delay, which may be, by way of non-limiting example, in the range of a few micro seconds) before raw BER and effective BER are again read).

If the value is determined in step 230 to be below the threshold, in step 235 an event record is placed in a queue 240, the event record including an error indication indicating a determination of expected port failure; the event record generally includes a time stamp, a port identification, and optionally additional information (particular examples of such records being shown, by way of particular non-limiting example, by reference numeral 250; see discussion above with reference to FIG. 1, regarding possible metadata).

In step 245, upon an event being written to the queue 240 (or, in alternative exemplary embodiments, upon an interrupt, upon a clock tick, etc.) one or more entries are read from the queue 240 and sent to a higher system level (such as to system software at a higher level) for further processing. Such further processing may include, by way of non-limiting example, notifying a system operator of the expected port failure, and/or sending an expected port failure message.

Figure 3:
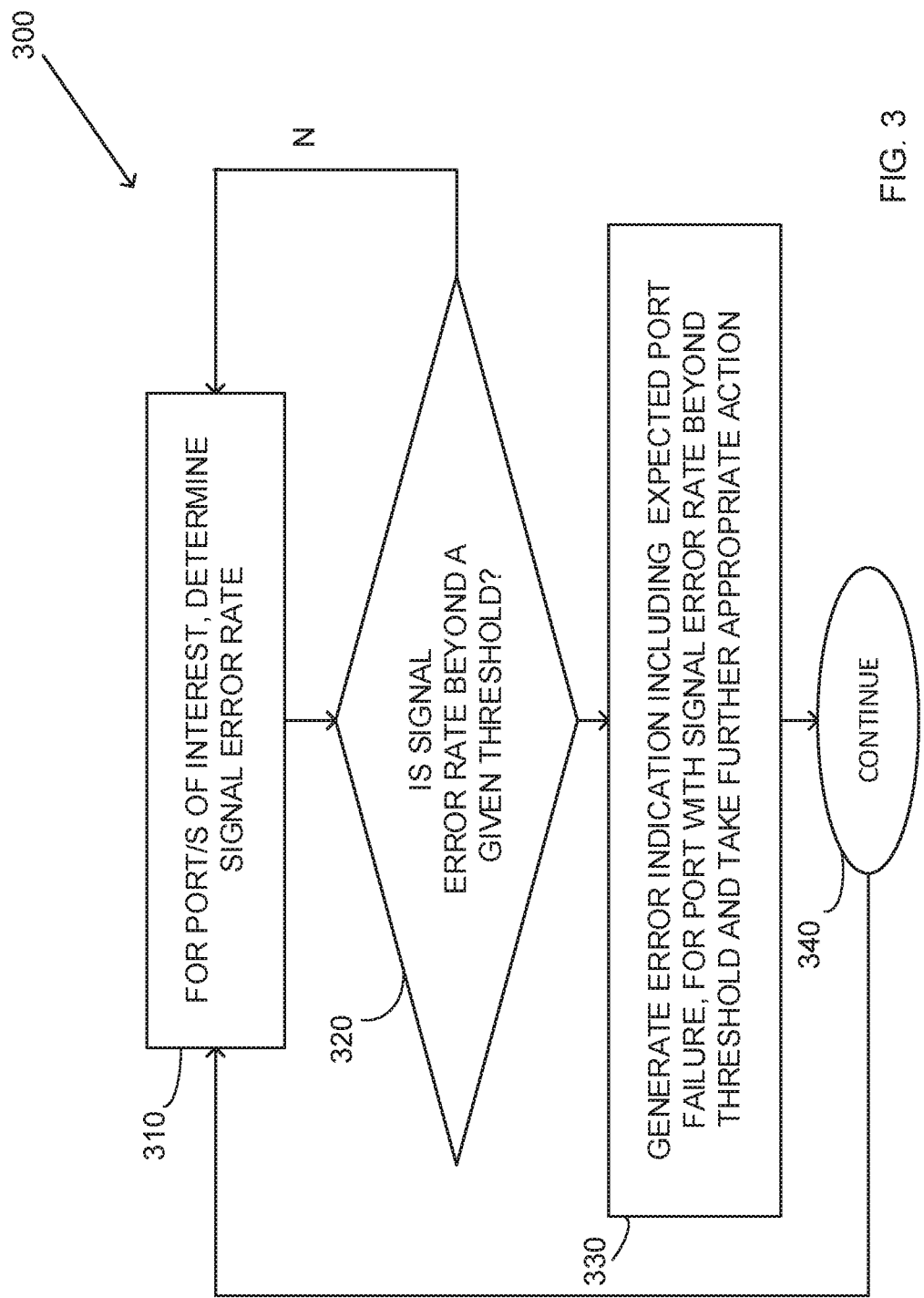
FIG. 3 is a simplified flowchart illustration of an exemplary method of operation of the exemplary system of FIG. 2.

Reference is now made to FIG. 3, which is a simplified flowchart illustration of an exemplary method of operation of the exemplary system of FIG. 2. In the exemplary method of FIG. 3, generally designated 300, a determination of signal error rate is made for a port or ports of interest (step 310). If the signal error rate is not beyond a given threshold (step 320), the method returns to step 310 (possibly after some appropriate delay, as described above with reference to FIG. 2). The concept of threshold is discussed above, with reference to FIGS. 1 and 2 and may include (depending on the type of link associated with the port, and by way of non-limiting example): an appropriate threshold related to a comparison of raw BER to corrected BER; or an appropriate threshold related to SNR, both as discussed above.

If the signal error rate is beyond the given threshold, then in step 330 an error indication is generated for the given port having the signal error rate beyond the threshold. The error indication includes an indication that the given port is likely to fail, and other appropriate action beyond generating the error indication (for example, as described above with reference to FIG. 2 and below with reference to FIG. 4) may be taken. The method then continues (step 340), returning to step 310.

While not explicitly shown in FIG. 3, there may be cases (for example, in either the BER case or the SNR case, as described above with reference to FIG. 1) in which a given port may recover, in the sense of no longer fulfilling a criterion indicating that failure is predicted; in such a case, a prediction that the link will no longer fail (cancelling, in a sense, the previous prediction of link failure) may be made, and such an indication may be generated in step 330, in place of an error indication.

Figure 4:
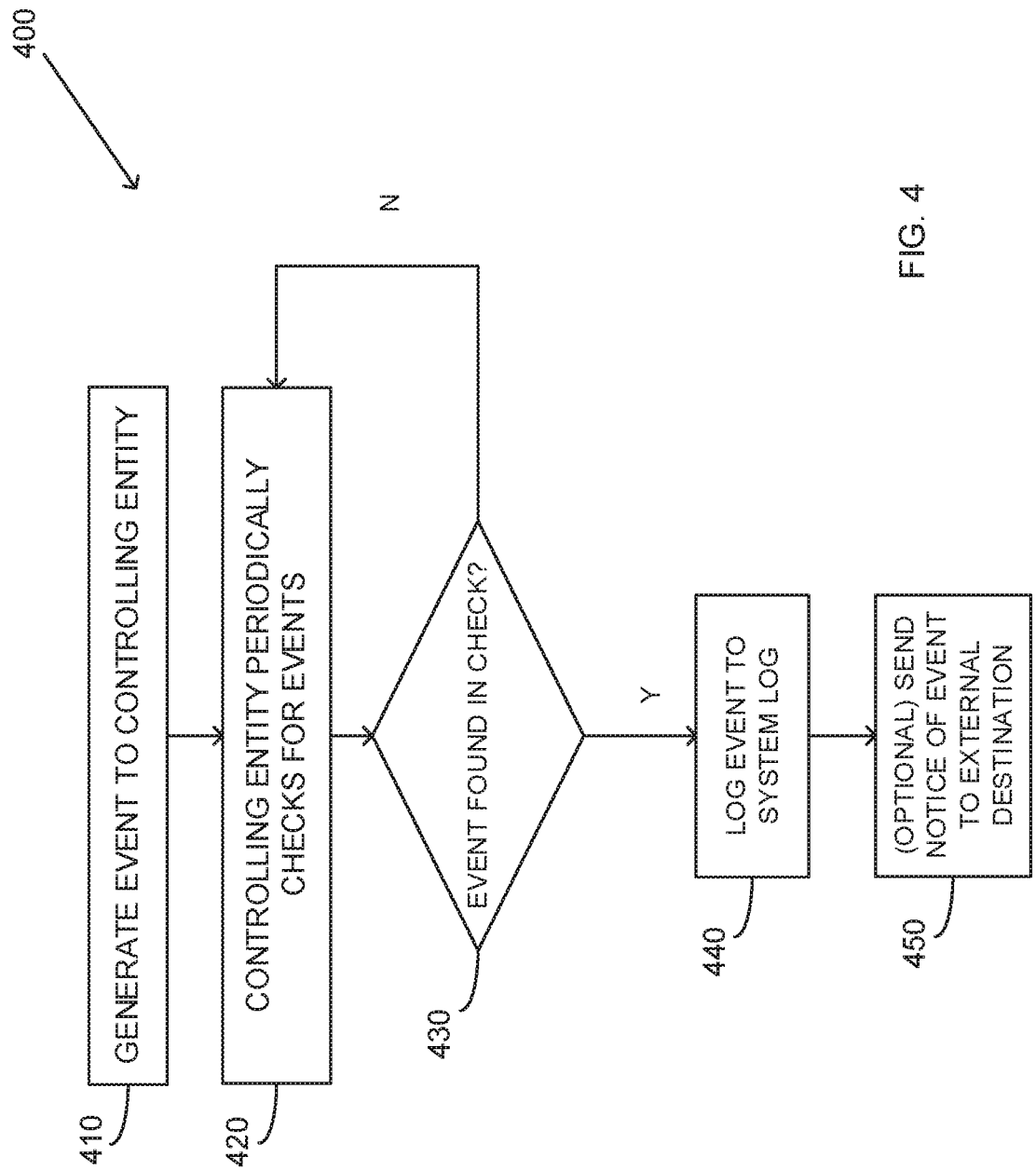
FIG. 4 is a simplified flowchart illustration of an exemplary method of operation of a portion of the exemplary method of FIG. 3.

Reference is now made to FIG. 4, which is a simplified flowchart illustration of an exemplary method of operation of a portion of the exemplary method of FIG. 3. The method of FIG. 4, generally designated 400, includes an exemplary method of operation of step 330 of FIG. 3.

In step 410, an event is generated, when appropriate, to a controlling entity (such as, by way of non-limiting example, by sending an event indication to a higher level of software in a layered software system or by notifying a system operator or operating entity).

In step 420, the controlling entity checks (periodically, in exemplary embodiments) to see if events have been indicated; alternatively, an interrupt may be issued to the controlling entity when events are indicated.

In step 430: If no events are found to have been indicated, processing returns to step 420; if events are found to have been indicated, processing continues with step 440.

In step 440, the event or events found are logged to a system log. Optionally, in step 450, notice of the event or events is sent to an external destination; such as, by way of non-limiting example, via one or more of the following: generating an SNMP event; generating a system event; and sending and SMS or a similar message.

It is appreciated that software components of the present invention may, if desired, be implemented in ROM (read only memory) form. The software components may, generally, be implemented in hardware, if desired, using conventional techniques. It is further appreciated that the software components may be instantiated, for example: as a computer program product or on a tangible medium. In some cases; it may be possible to instantiate the software components as a signal interpretable by an appropriate computer, although such an instantiation may be excluded in certain embodiments of the present invention.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited by what has been particularly shown and described hereinabove. Rather the scope of the invention is defined by the appended claims and equivalents thereof:

What is claimed is:

1. A method comprising:

determining, for a given hardware link, whether a signal error rate for signals sent over the given hardware link is beyond a given threshold; and when the signal error rate is beyond the given threshold, generating an error indication for the given hardware link, the error indication comprising a prediction that a hardware component associated with the given hardware link is likely to fail, wherein said determining whether the signal error rate is beyond the given threshold comprises:

determining a corrected error rate and an uncorrected error rate, the corrected error rate comprising effective bit error rate (effective BER) and the uncorrected error rate comprising raw bit error rate (raw BER);

comparing the corrected error rate and the uncorrected error rate; and when a result of comparing the corrected error rate and the uncorrected error rate is beyond the given threshold, generating an error indication for the given hardware link, and the signal error rate is determined to be beyond the given threshold according to the formula:

$$\mathrm{abs}(\log(\text{effective } BER) - \log(\text{raw } BER)) < t$$

wherein t is the given threshold and the raw BER is more than a predetermined minimum value.

2. The method according to claim 1 and wherein t is between 4.2 and 4.

3. The method according to claim 1 and wherein t is equal to 4.

4. The method according to claim 1 and wherein the hardware component comprises a switch.

5. The method according to claim 1 and also comprising, after generating said error indication:

when the signal error rate is no longer beyond the given threshold, generating a recovery indication for the given hardware link, the recovery indication indicating that it is no longer predicted that the hardware component associated with the given hardware link is likely to fail.

6. A failure forecasting system comprising:

link fail forecast circuitry configured to determine, for a given hardware link, whether a signal error rate for signals sent over the given hardware link is beyond a given threshold; and error determination circuitry configured, when the signal error rate is beyond the given threshold, to generate an error indication for the given hardware link, the error indication comprising a prediction that a hardware component associated with the given hardware link is likely to fail, wherein said link fail forecast circuitry is configured to determine whether the signal error rate is beyond the given threshold by:

determining a corrected error rate and an uncorrected error rate, the uncorrected error rate comprising raw bit error rate (raw BER), and the corrected error rate comprising effective bit error rate (effective BER);

comparing the corrected error rate and the uncorrected error rate; and when a result of comparing the corrected error rate and the uncorrected error rate is beyond the given threshold, generating an error indication for the given hardware link, and the signal error rate is determined to be beyond the given threshold according to the formula:

$$\mathrm{abs}(\log(\text{effective } BER) - \log(\text{raw } BER)) < t$$

wherein t is the given threshold, and wherein the raw BER is more than a predetermined minimum value.

7. The system according to claim 6 and wherein t is between 4.2 and 4.

8. The system according to claim 6 and wherein t is equal to 4.

9. The system according to claim 6 and wherein the hardware component comprises a switch.

10. The system according to claim 6 and wherein said error determination circuitry is also configured, after the generating said error indication:

when the signal error rate is no longer beyond the given threshold, to generate a recovery indication for the given hardware link, the recovery indication comprising an indicating that it is no longer predicted that the hardware component associated with the given hardware link is likely to fail.

* * * * *